US006618118B2

(12) United States Patent
Minnaert et al.

(10) Patent No.: US 6,618,118 B2
(45) Date of Patent: Sep. 9, 2003

(54) OPTICAL EXPOSURE METHOD, DEVICE MANUFACTURING METHOD AND LITHOGRAPHIC PROJECTION APPARATUS

(75) Inventors: Arthur Winfried Eduardus Minnaert, Veldhoven (NL); Henricus Wilhelmus Maria Van Buel, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/138,513

(22) Filed: May 6, 2002

(65) Prior Publication Data

US 2002/0171818 A1 Nov. 21, 2002

(30) Foreign Application Priority Data

May 8, 2001 (EP) .............................. 01201673
Mar. 28, 2002 (EP) .............................. 02252336

(51) Int. Cl.[7] .............................................. G03B 27/52
(52) U.S. Cl. ....................................... 355/30; 355/67
(58) Field of Search ............................. 355/67, 53, 30

(56) References Cited

U.S. PATENT DOCUMENTS

| | | | | |
|---|---|---|---|---|
| 4,477,182 A | * | 10/1984 | Takanashi et al. | ............ 355/43 |
| 4,629,313 A | * | 12/1986 | Tanimoto | .................... 355/53 |
| 5,204,224 A | | 4/1993 | Suzuki | ...................... 430/315 |
| 5,359,389 A | | 10/1994 | Isohata | ........................ 355/53 |
| 5,442,416 A | * | 8/1995 | Tateyama et al. | ........... 396/612 |
| 5,929,976 A | | 7/1999 | Shibuya et al. | |
| 5,982,474 A | * | 11/1999 | Akiyama et al. | ............. 355/50 |
| 6,288,773 B2 | * | 9/2001 | Johnson et al. | ............... 355/30 |

FOREIGN PATENT DOCUMENTS

| | | |
|---|---|---|
| EP | 0 325 930 A1 | 8/1989 |
| EP | 0 788 032 A1 | 8/1997 |
| EP | 0 920 053 A3 | 6/1999 |
| EP | 0 920 053 A2 | 6/1999 |
| JP | 04071224 | 3/1992 |

OTHER PUBLICATIONS

European Search Report for Application No. 01 20 1673, dated Nov. 5, 2001.

* cited by examiner

*Primary Examiner*—Russell Adams
*Assistant Examiner*—D. Ben Esplin
(74) *Attorney, Agent, or Firm*—Pillsbury Winthrop LLP

(57) ABSTRACT

An optical exposure method carried out on a substrate that is at least partially covered by a layer of radiation-sensitive material, the method comprising: providing a plurality of projection beams of radiation; a first irradiating step of irradiating a peripheral annulus of the layer of radiation-sensitive material with a first one of said projection beams; and a second irradiating step of irradiating at least one inner portion of the radiation-sensitive material situated nearer the center of the substrate than the inner periphery of the outer region with a second one of said projection beams; wherein said first and second irradiating steps are carried out with the substrate positioned at the same location. The method can be used for edge bead removal (both coarse and fine detail) and marker clearout at a single station. Stencils can be used to modify the shape and size of the irradiating steps. Such a method can be incorporated as a part of a device manufacturing method but can be used as an single method. A lithographic projection apparatus can be adapted to apply this method, and the main projection apparatus beneficially shares metrology data with the optical exposure apparatus.

22 Claims, 4 Drawing Sheets

OPTICAL EXPOSURE METHOD, DEVICE MANUFACTURING METHOD AND LITHOGRAPHIC PROJECTION APPARATUS

This application claims priority from EP 01201673.9 filed May 8, 2001 and EP 02252336.9 filed Mar. 28, 2002, herein incorporated by reference.

1. Field

The present invention relates generally to optical exposure apparatus and more particularly to irradiating radiation-sensitive material.

2. Background

The term "patterning structure" as here employed should be broadly interpreted as referring to structure or means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on such mirror arrays can be gleaned, for example, from U.S. Pat. Nos. 5,296,891 and 5,523,193, and PCT Patent Applications WO 98/38597 and WO 98/33096, which are incorporated herein by reference. In the case of a programmable mirror array, the said support structure may be embodied as a frame or table, for example, which may be fixed or movable as required. A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Patent Application WO 98/40791, incorporated herein by reference.

As stated above, before a substrate is exposed in a lithographic process, the major surface of the substrate on which exposure is to occur is coated with a layer of photosensitive material (hereinafter referred to as resist). This is conventionally achieved by a spin-coating procedure, in which the substrate is rotated at high speed and the liquid resist is dispensed from a spout onto the rotating major surface; distribution of the liquid over the major surface is then achieved inter alia as a result of centrifugal force. However, this same centrifugal force, together with meniscus effects along the edge of the substrate, often leads to an increased accumulation of resist along the perimeter of the major surface. This is highly undesirable, since it causes a non-uniform thickness of the resist layer within several target areas close to the perimeter; this not only can affect imaging quality during the lithographic exposure, but can also cause unwanted chemical effects during subsequent development of the exposed resist layer. It is therefore generally sought to remove this peripheral resist accumulation before exposure commences. This procedure is conventionally referred to as edge bead removal (EBR).

A further problem that can occur with resist layers concerns the alignment marks that are typically present on the said major surface of the substrate. During the lithographic exposure process, such marks are used in conjunction with similar marks on the mask so as to effect correct alignment of the mask pattern to (existing patterned layers on) the substrate. This is generally achieved using an optical detection system (so-called alignment system), which relies on interference effects that occur when an image of an alignment mark from the mask/wafer is superimposed upon an alignment mark on the wafer/mask. However, an annoying phenomenon can be caused by the presence of a resist layer over such alignment marks on the substrate. This is because the optical nature of the alignment process is sensitive to thin-film effects that can occur in the resist layer overlying the mark, such as interference, diffraction and refraction, for example; this so-called process dependency can cause errors in the signals generated by the alignment system, leading to flawed alignment. It is therefore generally sought to periodically remove the resist layer in a localized area overlying each of the various alignment marks on said major surface. This procedure is conventionally referred to as marker clearout (MC). As used in this text, the term is also intended to refer to the localized removal of resist from reference marks on the substrate other than alignment marks, such as substrate ID marks (e.g. in the form of a barcode), etc.

In the prior art, edge bead removal and marker clearout can be performed in a number of ways. For example, edge bead removal can occur by spraying an appropriate solvent (such as acetone) in a controlled fashion along the perimeter of the substrate. This is often done in a so-called wafer track, which is a machine placed beside the lithographic apparatus and in connection therewith, and in which substrates are spin-coated and dried prior to exposure, and given a preliminary bake after exposure. One can appreciate, however, that edge bead removal using a solvent in this manner is a rather risky procedure, since it may involve droplets of solvent being unintentionally thrown onto planned die areas of the substrate, leading to failed further processing of such dies. This risk increases as die size increases, since the probability then also increases that a given die will be hit by a landing droplet of solvent.

A similar procedure might be contemplated to achieve marker clearout, but that would be even riskier than in the case of edge bead removal. Consequently, marker clear out is generally achieved using an exposure technique, whereby a small area around each mark is irradiated with radiation of an appropriate wavelength/energy to cause exposure of that area; during subsequent development of the substrate, the exposed area above the mark will then also be developed. This marker clearout technique is performed in series with the normal lithographic exposure of the substrate using a mask, and it therefore causes a time penalty. Since the throughput of the lithographic process substantially determines the cost of ownership of the (generally very expensive) lithographic apparatus, it is of utmost importance to keep time penalties to a minimum.

SUMMARY

In an aspect of at least one embodiment of the invention, there is provided a single exposure apparatus with which both edge bead removal and marker clearout can be performed, which advantageously is fast and efficient in its operation, so as to cause as small a time penalty as possible as a result of its use.

According to at least one embodiment of the invention, there is provided an optical exposure method carried out on a substrate that is at least partially covered by a layer of radiation-sensitive material, the method comprising:

providing a plurality of projection beams of radiation;

a first irradiating step of irradiating a peripheral annulus of the layer of radiation-sensitive material with a first one of said projection beams; and a second irradiating step of irradiating at least one inner portion of the radiation-sensitive material situated nearer the center of the substrate than the inner periphery of the outer region with a second one of said projection beams;

wherein said first and second irradiating steps are carried out with the substrate positioned at the same location.

According to at least one embodiment of the invention, there is provided a device manufacturing method comprising:

providing a substrate that is at least partially covered by a layer of radiation-sensitive material;

providing a primary projection beam of radiation;

using patterning structure to endow the primary projection beam with a pattern in its cross-section;

projecting the patterned beam of radiation onto a target portion of the layer of radiation-sensitive material; and performing clearout by the method described above of a portion of the layer of radiation-sensitive material not exposed in the projecting step.

According to at least one embodiment of the invention, there is provided a lithographic projection apparatus comprising a main projection apparatus, the main projection apparatus comprising:
  a primary radiation system for providing a primary projection beam of radiation;
  a support structure for supporting patterning structure, the patterning structure serving to pattern the primary projection beam according to a desired pattern;
  a primary substrate table for holding a substrate;
  a primary projection system for projecting the patterned primary projection beam onto at least a target portion of the substrate;
  wherein the lithographic projection apparatus further comprises an optical exposure apparatus comprising:
    a second radiation system for providing a second beam of radiation;
    a second substrate table for holding a substrate;
    a second projection system for projecting said second beam onto a portion of said substrate,
    wherein the second radiation system is embodied to provide a plurality of secondary component beams of radiation;
    the second projection system correspondingly comprises a plurality of secondary component projection systems, each of which serves to project one of said secondary component beams onto the substrate;
    at least one of said secondary component projection systems is flexible in such a manner that an extremity thereof proximal the substrate can be displaced in a direction parallel to the plane of the substrate, while an extremity thereof distal the substrate remains fixed relative to said plane;
    said second substrate table can be rotated parallel to said plane;
    wherein the optical exposure apparatus and the main projection apparatus share metrology data.

Although specific reference may be made in this text to the use of the apparatus according to at least one embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The person skilled in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm) as well as particle beams such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts and in which.

DETAILED DESCRIPTION

Figure 1:
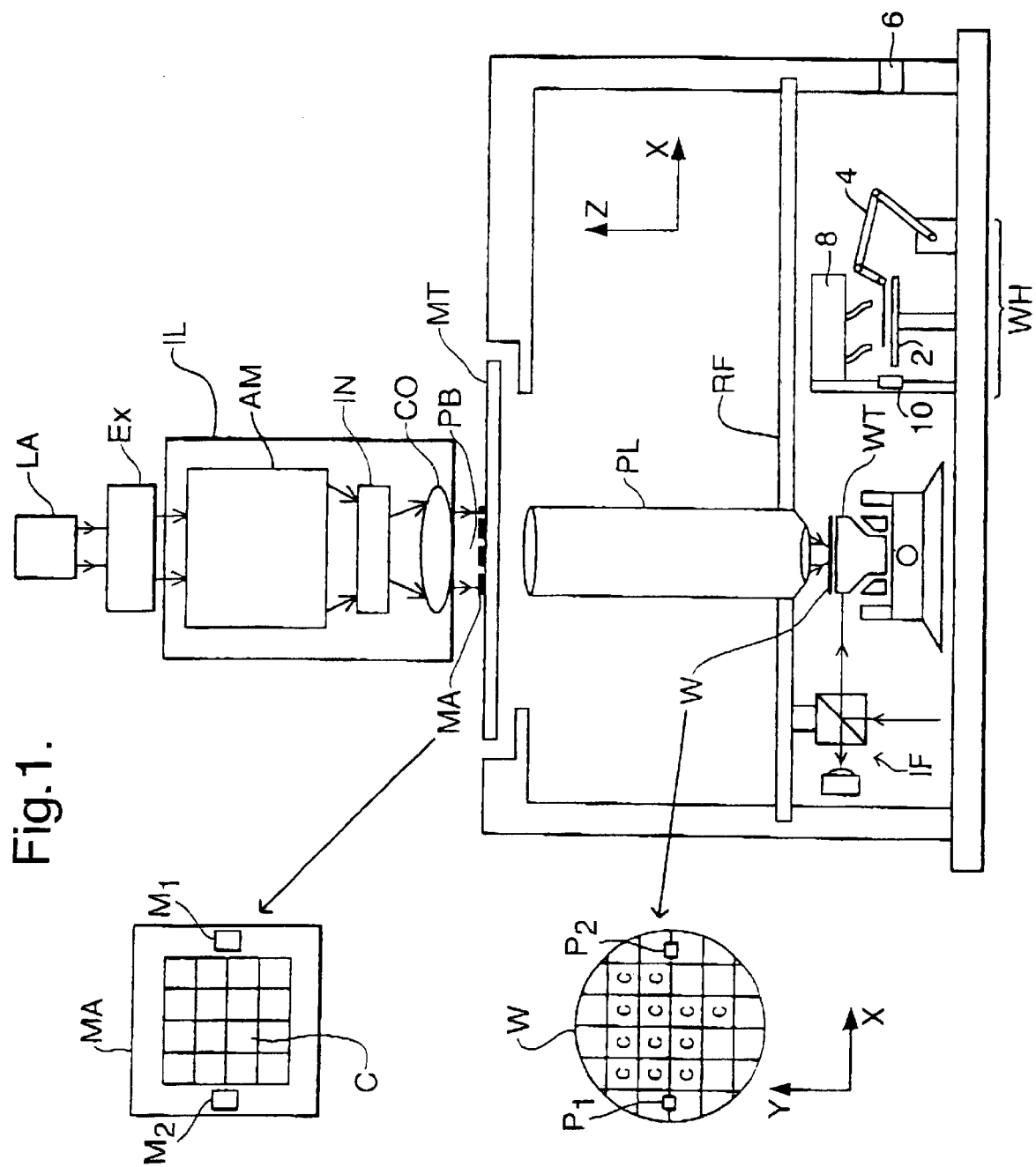
FIG. 1 depicts a lithographic projection apparatus according to at least one embodiment of the invention.

The present invention relates to an optical exposure method carried out on a substrate that is at least partially covered by a layer of radiation-sensitive material, the method comprising: providing a plurality of projection beams of radiation; a first irradiating step of irradiating a peripheral annulus of the layer of radiation-sensitive material with a first one of said projection beams; and a second irradiating step of irradiating at least on inner portion of the radiation-sensitive material situated nearer the center of the substrate than the inner periphery of the outer region with a second one of said projection beams.

The invention further relates to a device manufacturing method comprising: providing a substrate that is at least partially covered by a layer of radiation-sensitive material; providing a primary projection beam of radiation; using patterning structure to endow the primary projection beam with a pattern in its cross-section; and projecting the patterned beam of radiation onto a target portion of the layer of radiation-sensitive material.

The invention further relates to a lithographic projection apparatus comprising: a primary radiation system for providing a primary projection beam of radiation; a support structure for supporting patterning structure, the patterning structure serving to pattern the primary projection beam according to a desired pattern; a primary substrate table for holding a substrate; and a primary projection system for projecting the patterned primary projection beam onto at least a target portion of the substrate.

According to at least one embodiment of the invention, there is provided a lithographic projection apparatus comprising a main projection apparatus, the main projection apparatus comprising:
  a primary radiation system for providing a primary projection beam of radiation;
  a support structure for supporting patterning structure, the patterning structure serving to pattern the primary projection beam according to a desired pattern;
  a primary substrate table for holding a substrate;
  a primary projection system for projecting the patterned primary projection beam onto at least a target portion of the substrate;
  wherein the lithographic projection apparatus further comprises an optical exposure apparatus comprising:
    a second radiation system for providing a second beam of radiation;
    a second substrate table for holding a substrate;
    a second projection system for projecting said second beam onto a portion of said substrate, wherein the second radiation system is embodied to provide a plurality of secondary component beams of radiation;

the second projection system correspondingly comprises a plurality of secondary component projection systems, each of which serves to project one of said secondary component beams onto the substrate;

at least one of said secondary component projection systems is flexible in such a manner that an extremity thereof proximal the substrate can be displaced in a direction parallel to the plane of the substrate, while an extremity thereof distal the substrate remains fixed relative to said plane;

said second substrate table can be rotated parallel to said plane;

wherein the optical exposure apparatus and the main projection apparatus share metrology data.

To avoid duplication of data, the optical exposure apparatus shares metrology data with the main projection apparatus. Metrology data includes the dimensions of the substrate, eccentricity of the substrate and information regarding the location of markers, wafer identification marks, notches or flats, as well as details about the exposure dose. The metrology data, also referred to as job data, thus includes the necessary information for the exposure of target portions as well as for the subsequent edge bead removal and marker clear-out. By providing this data to the integrated lithographic projection and exposure apparatus in a single lot, time is saved and the complexities of transporting the requisite data along with each wafer to a separate exposure apparatus are avoided. The possibilities for error are reduced.

In at least one embodiment of the invention, the plurality of secondary component beams emerging from the radiation system may, for example, be generated by using beam splitting means to sub-divide a single incident beam; examples of such means include prisms and diffractive optical elements (arrays of Fresnel lenses or lens segments), with or without additional beam conditioning optics such as collimating, condensing and/or focusing lenses or mirrors. In a preferred embodiment the beam is split into secondary component beams by a cloverleaf lens. This minimizes light loss during beam splitting. The cloverleaf lens must have at least the number of leaves which corresponds to the number of secondary component projection systems. Alternatively, the said plurality of beams can be provided from a plurality of individual radiation sources.

In at least one embodiment of the lithographic projection apparatus according to the invention, the proximal extremity of the (or each) flexible component projection system is displaceable radially with respect to the plane of the substrate. Because the second substrate table can be rotated in-plane, such radial motion allows any point $(r, \theta)$ on the outward-facing major surface of the substrate to be accessed by the said proximal extremity.

In at least one embodiment of the lithographic projection apparatus according to the invention, each of the secondary component projection systems is flexible in the said manner. This allows optimal parallel processing in the apparatus.

The desired flexibility of the (or each) secondary component projection system can be achieved by embodying it (or them) to comprise a flexible light guide. An example of such a light guide is a thick optical fiber or a bundle of such fibers. However, the inventors have observed that particularly satisfactory results are obtained using a liquid-filled light guide. In addition to said flexible light guide, each secondary component projection system will typically comprise a focusing system comprising one or more lenses; this will typically be located at the said proximal extremity, and serves to focus radiation emerging from the flexible light guide onto the substrate.

In at least one embodiment of the invention, stencil holders are located between the second radiation system and the second substrate table, such that the radiation traversing each secondary component projection system can be provided with a stencil pattern. An example of such a stencil pattern might be a circular, square or rectangular aperture in a dark field, the dimensions of the aperture being chosen relative to those of the alignment marks (and/or substrate ID mark) on the substrate in such a manner that each alignment mark fits neatly within the bounds of the projected image of the aperture. The stencil holder is preferably located near said proximal extremity of each secondary component projection system, though it is also possible to place it at said distal extremity, for example. In a refinement, there are two secondary component projection systems, each stencil pattern comprises an aperture in an opaque field, and the aperture for one of the component projection systems is larger than for the other. Such a set-up allows EBR and/or MC to be performed in a two-step fashion (coarse and fine). In particular, in the case of EBR, the coarse (larger) aperture can be used in one or more sweeps to expose one or more concentric (and slightly overlapping) bands of resist along the substrate perimeter, while the fine (smaller) aperture is concurrently used to perform an innermost, limiting sweep nearest to the die areas on the substrate.

In at least one embodiment of the invention, the exposure apparatus is provided with alignment means, by means of which the position and orientation of the substrate with respect to the rotational axis of the second substrate table can be measured. Such means may, for example, employ an optical sensor (such as a CCD) placed near the edge of the substrate and on one side of its plane, and a light source that directs a light beam toward the optical sensor from the other side of the substrate plane, in such a manner that the substrate edge partially eclipses the said light beam; by rotating the substrate on the second substrate table and concurrently measuring the output signal from the optical detector, the eccentricity of the substrate on the table can be measured, together with the position of a reference feature on the substrate edge, such as a notch or flat portion. As an alternative, one could contemplate a mechanical sensor, though such an embodiment is generally less preferable than the optical alternative. In a refinement, the apparatus comprises substrate moving means, by means of which said position and/or orientation of the substrate on the second substrate table can be adjusted. This allows any measured eccentricity to be corrected before EBR/MC commence.

Incorporation of the exposure apparatus in the lithographic apparatus allows EBR and/or MC to be done in an efficient manner between entry of a substrate into the apparatus and projection of the mask image thereupon. Moreover, the lithographic apparatus will generally comprise a substrate handling module; such a substrate handling module generally comprises a turntable, pre-aligner and substrate handling robots, all of which can be exploited by the inventive exposure apparatus. Examples of such substrate handling modules are given in European Patent Applications EP 1 052 546 and EP 1 052 548, for instance, though many modifications of the described designs are possible. The inventive optical exposure apparatus can be very successfully located within or adjacent to the substrate handling module in order to easily facilitate the sharing of metrology data.

An advantage of incorporating the inventive exposure apparatus into a lithographic apparatus is that it becomes possible to divert a portion of the radiation out of the primary radiation system of the apparatus and into the second radiation system of the EBR/MC apparatus. This saves space and money, especially when working at wavelengths (such as 193 nm or 157 nm, for example) that are typically produced by an (expensive) excimer laser rather than a lamp.

FIG. 1 schematically depicts a lithographic projection apparatus that is provided with an optical exposure apparatus according to at least one embodiment of the invention. The projection apparatus comprises:

- a primary radiation system Ex, IL, for supplying a primary projection beam PB of radiation. In this particular case, the primary radiation system also comprises a radiation source LA;
- a first object table (mask table) MT provided with a mask holder for holding a mask MA (e.g. a reticle), and connected to first positioning means for accurately positioning the mask with respect to item PL;
- a second object table (primary substrate table) WT provided with a substrate holder for holding a substrate W (e.g. a resist-coated silicon wafer), and connected to second positioning means for accurately positioning the substrate with respect to item PL;
- a primary projection system ("lens") PL (e.g. a refractive, catoptric or catadioptric optical system) for imaging an irradiated portion of the mask MA onto a target portion C (e.g. comprising one or more dies) of the substrate W. Alignment marks $M_1$, $M_2$, $P_1$, $P_2$ are used respectively to align the mask MA and substrate W. As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser (e.g. based on KrF, ArF or $F_2$ lasing). The present invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the primary substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The primary substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the primary substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The apparatus is also provided with a substrate handling station WH. The station WH comprises a turntable (substrate table) 2, substrate handling robot 4, entry/exit port 6 and pre-aligner 10. In this particular case, it has been furnished with an optical exposure apparatus 8, thereby efficiently exploiting the presence of the turntable 2, robot 4 and alignment means (pre-aligner) 10.

Figure 2:
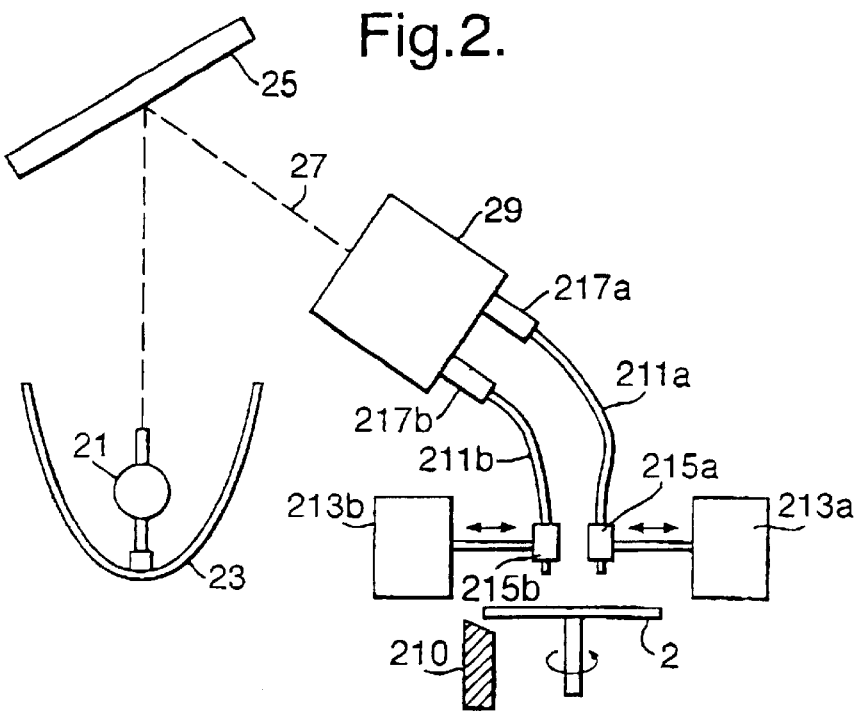
FIG. 2 shows an optical exposure apparatus according to at least one embodiment of the invention.

FIG. 2 shows part of an optical exposure apparatus according to at least one embodiment of the invention. A mercury lamp 21 produces broadband UV radiation that is collected by an elliptical mirror 23 and directed towards a conditioning mirror 25. The conditioning mirror 25 is provided with selective optical coating(s) such that a large portion of the spectrum produced by the lamp 21 is absorbed by the mirror 25, whereas only a narrow portion of that spectrum is reflected along axis 27. Behind the mirror is a heat absorber 32 (See FIG. 5) which keeps the mirror cool.

Item 29 comprises beam splitting means that serve to sub-divide the beam entering along axis 27 into a plurality of component beams; in this case, the plurality is two. The component beams are directed by the beam splitting means 29 into two component projection systems, 211a and 211b. The actual splitting operation may be performed using an element such as a polarizing beam splitter, a knife-edge wedge pair, or a diffractive optical element, for example. In addition to such an element, the beam splitting means 29 may comprise one or more lenses so as to improve the efficiency with which the component beams are coupled into the component projection systems 211a, 211b; in this respect, one would like to achieve as a high an efficiency as possible, since lost intensity entails lower throughput.

Figure 5:
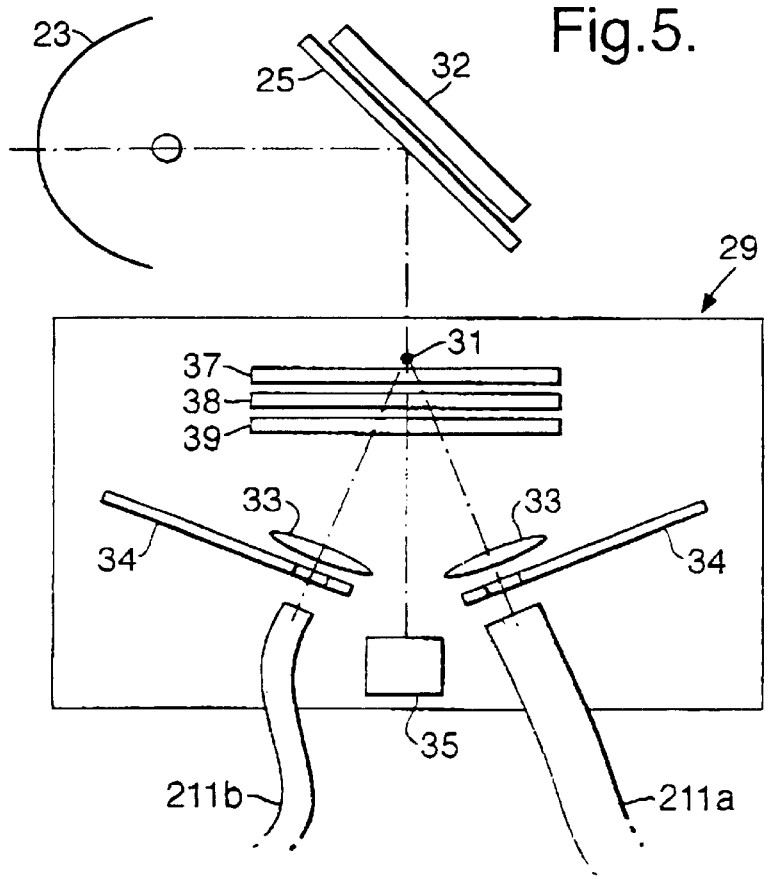
FIG. 5 shows an optical exposure apparatus with an enlarged view of the beam splitting means according to at least one embodiment of the invention.
Figure 6:
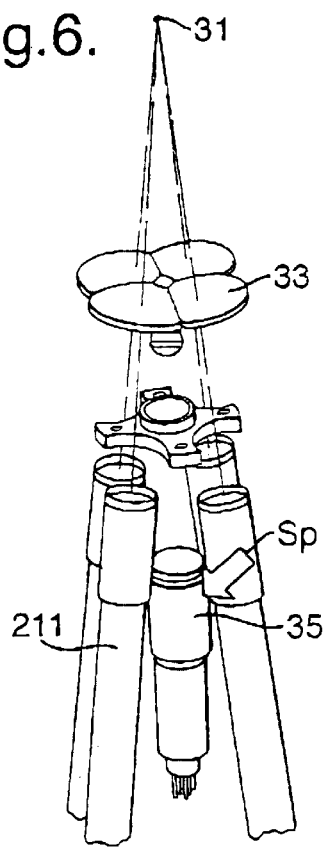
FIG. 6 shows a further view of part of the optical exposure apparatus according to at least one embodiment of the invention.

In at least one embodiment of the present invention, the beam splitting means 29 shown in FIGS. 5 and 6 comprises a cloverleaf shaped lens 33 with four individual lenses. The position of the lamp 21 is optimized using information from the spot sensor 35. The optical axes of the individual lenses of the cloverleaf shaped lens 33 are at an angle of 9° to the optical axis of the exposure light beam and intersect the second focal point 31 of elliptical mirror 23. It is possible to control the number of light beams through the use of a shutter 34 behind each of the lenses in the cloverleaf lens. This particular beam splitting means allows minimal loss of light through beam splitting.

In the vicinity of the second focal point 31 of the elliptical mirror 23 are a safety shutter 37, a block filter 38 and an interference band-pass filter 39. The block filter 38 blocks damaging high frequency UV light.

Both component projection systems 211a, 211b are flexible in such a manner that their extremities 215a, 215b proximal the table 2 can be displaced in a direction parallel to the plane of the table 2, while their extremities 217a, 217b distal the table 2 remain fixed relative to said plane. Such flexibility may be achieved by embodying each component projection system to comprise a flexible light guide, such as an optical fiber, bundle of optical fibers or a liquid-filled light guide. A liquid-filled guide is a hollow tube filled with an appropriate liquid; a suitable such liquid is a slightly acidic salt solution with a pH value of around 5, whereas the said fiber(s)/tube may be comprised of silica or PMMA, for example. In this embodiment, the flexible light guides in the component projection systems 211a, 211b have respective diameters of 3 mm and 8 mm, and a length of approximately 1 m.

Figure 4:
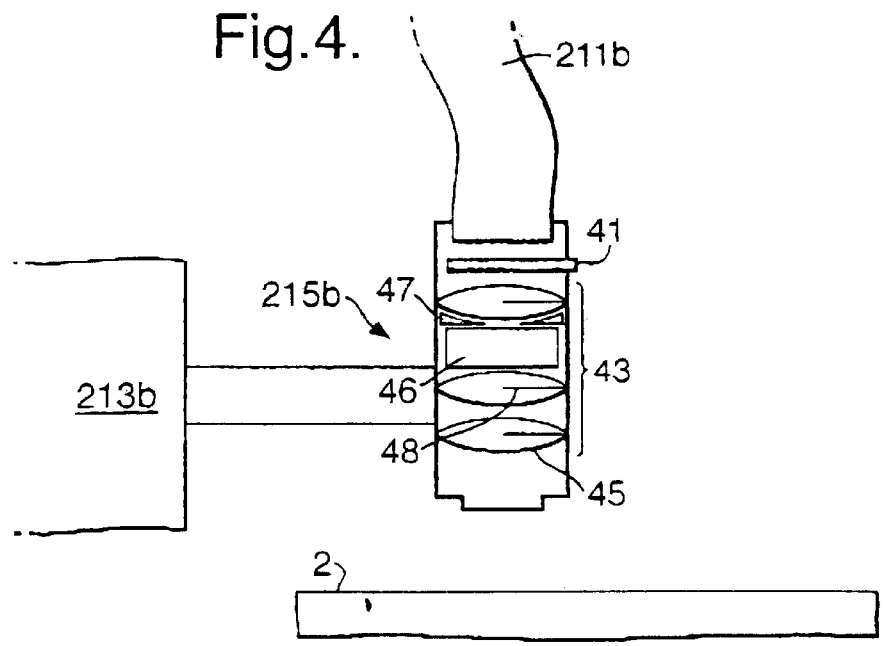
FIG. 4 shows part of one of the secondary component projection systems in an optical exposure apparatus according to at least one embodiment of the invention.

Also present in each component projection system is a focusing system, shown in more detail in FIG. 4 for the case of component projection system 211b. This focusing system 43 (comprising one or more lenses 45) is located at proximal extremity 215a and serves to focus radiation onto the table 2 in a suitable manner; the details of such a focusing system 43 are a matter of design choice, and are at the discretion of the person skilled in the art. In at least one embodiment of the present invention, the lenses 45 and spacers 46 of the focusing system 43 are not bonded or laser aligned. The lenses 45 and spacers 46 are positioned on wedge shaped holders such that they are self-aligning with the optical axis. Springs 48 can be used to center the spacers and lenses. A stencil holder 41 as described above may also be incorporated at the proximal extremity 215a, 215b, between each flexible light guide and its respective focusing system; alternatively, the entrance aperture (217a, 217b) to each component projection system 211a, 211b can be provided with such a stencil holder 41. The stencil for use in said stencil holder may, for example, comprise an (interchangeable) plate provided with an aperture having an appropriate form and size. Examples of such patterns, and their uses, will be discussed below. Also provided at the extremities 217a, 217b are shutter means, to allow exposure through the component projection systems 211a, 211b to be (individually) started and finished at will.

Actuation means 213a, 213b allow the extremities 215a, 215b to be accurately moved back and forth in a direction parallel to a radius of the (circular) table 2. This, combined with the fact that the table 2 can be rotated, allows any co-ordinate point (r,θ) on the plane of the substrate table 2 to be accessed by at least one of the extremities 215a, 215b. In a refinement, the extremities 215a, 215b can be actuated alongside one another, allowing each to fully access all co-ordinate points (r,θ) on the table plane. Assuming that one knows the co-ordinates (r,θ) of a particular point on a substrate (e.g. the center of an alignment mark) placed on the table 2, one can use the actuation means 213a or 213b, in combination with an appropriate rotation of the table 2, to access that particular point with the extremity 213a or 213b. Prior to this, one will have performed a calibration step using the alignment means 210, allowing determination of the following:

(1) a possible eccentric placement of the substrate on the table 2, i.e. a situation whereby the center of the substrate does not lie on the rotational axis of the table 2;

(2) the position of a reference feature on the substrate perimeter (e.g. a notch or flat portion).

Using this data, the eccentricity can be corrected (e.g. using the robot arm 4 in FIG. 1 to adjust the position of the substrate on the table), and the position of the reference feature referred to in (2) serves as a reference in determining θ.

Figure 7:
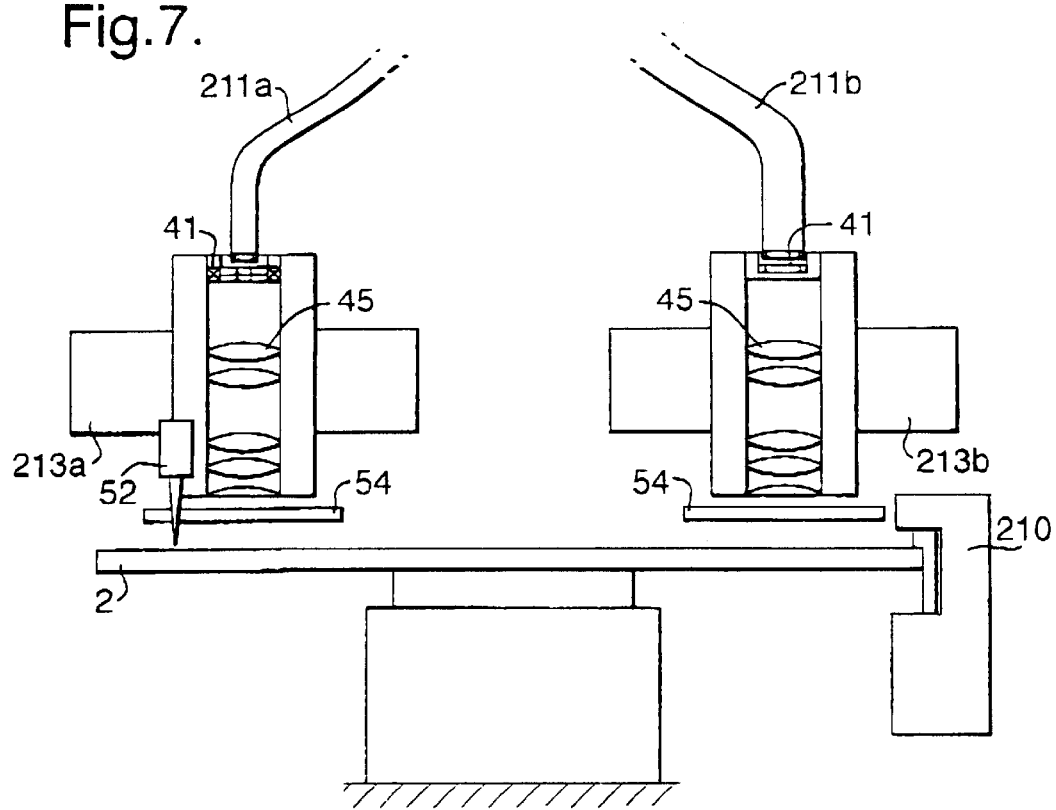
FIG. 7 shows part of the secondary component projection systems according to at least one embodiment of the invention.

A protective window 54 (See FIG. 7) serves to protect the optics in the focusing system from damage due to residue.

The focus sensor 52 (See FIG. 7) determines if the substrate is in focus and focusing can be achieved either by moving the table 2 up and down perpendicular to its plane, or by embodying the actuators 213a, 213b to allow movement of the extremities 215a, 215b in that direction.

According to at least one embodiment of the invention, there is provided an optical exposure method carried out on a substrate that is at least partially covered by a layer of radiation-sensitive material, the method comprising:

providing a plurality of projection beams of radiation;

a first irradiating step of irradiating a peripheral annulus of the layer of radiation-sensitive material with a first one of said projection beams; and a second irradiating step of irradiating at least one inner portion of the radiation-sensitive material situated nearer the center of the substrate than the inner periphery of the outer region with a second one of said projection beams;

wherein said first and second irradiating steps are carried out with the substrate positioned at the same location.

In at least one embodiment, coarse detail irradiation is performed by the first projection beam and fine detail irradiation is performed by the second projection beam.

In at least one embodiment of this aspect of the invention, one of the irradiated inner portions is adjacent to the irradiated outer peripheral annulus, such that for example concentric circles are formed. The irradiated inner portion could also be, for example, rectangular in shape. In at least one embodiment, the irradiated inner portions are alignment marks or wafer identification marks on the substrate. Both edge bead removal and marker clearout are therefore achieved at a single station.

The inventors have realized that, in order to prevent a substantial time penalty as a result of the edge bead removal and marker clearout procedure, the intended exposure apparatus for performing these functions must be able to process a substrate at least as quickly as the (fastest) lithographic projection apparatus used to perform imaging on the substrate. Since state-of-the-art lithographic apparatus can achieve throughputs of the order of 120 substrates per hour, this implies that the EBR/MC apparatus must be able to process a substrate in at most 30 seconds. The EBR/MC apparatus according to at least one embodiment of the invention aims to achieve this goal inter alia by virtue of its ability to perform parallel processing: because there are several component projection systems, they can be concurrently busy with different tasks on the same substrate.

Moreover, because at least one of the component projection systems is flexible in the described manner, different areas on a substrate can be accessed by moving the proximal extremity of the (or each) flexible component projection system relative to the substrate, instead of having to move the substrate relative to the projection system. This has advantages in that the resulting apparatus occupies less space, since the substrate table does not have to be laterally movable by an amplitude equal to the substrate diameter and lateral movement of the (relatively lightweight) component projection system(s) can be achieved more easily than lateral movement of the substrate table, which may be rotating at the point in time when lateral movement is desired.

Figure 3:
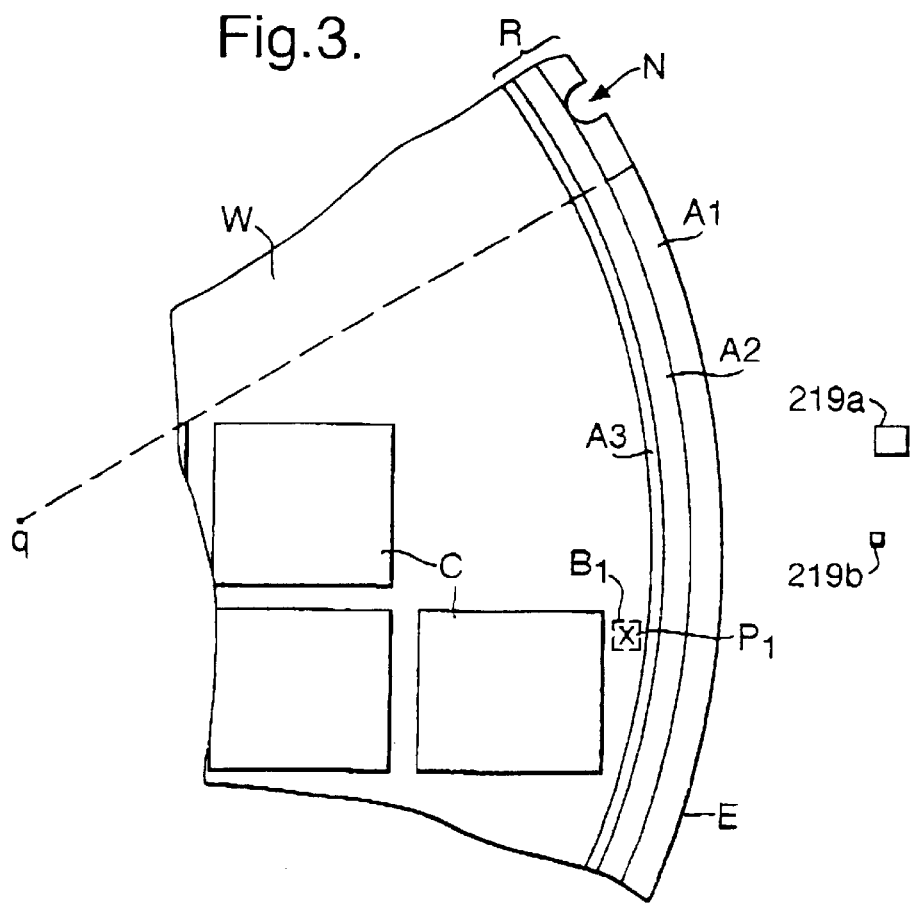
FIG. 3 renders a plan view of part of a substrate on which EBR and MC have been performed using the exposure apparatus according to at least one embodiment of the invention.

FIG. 3 shows a plan view of part of a substrate W having a center q and a notch N at a given location along its perimeter E. Also shown are some target areas C and an alignment mark $P_1$. As here depicted, EBR has been performed on a peripheral area/annulus R extending along and just inside the perimeter E, and MC has been performed on the alignment mark $P_1$. This has been achieved by providing stencil patterns to the component projection systems 211a, 211b of FIG. 2 in such a manner as to project the respective images ("spots") 219a, 219c at the plane of the substrate. As here depicted, spot 219a measures approximately 0.9×0.9 mm$^2$, whereas spot 219b measures approximately 2.4×2.4 mm$^2$. Stencils of differing size and form can be used to improve the accuracy of the apparatus.

As here depicted, EBR has been performed in multiple strokes, each time holding one (or both) of the spots 219a, 219b stationary above the surface of the substrate W at an appropriate radial position inside the perimeter E, and rotating the substrate W around its center q. "Coarse" annuli A1, A2 were done using spot 219a, whereas "fine" annulus A3 was done using spot 219b; if desired, annulus A3 could be done concurrently with one of the annuli A1, A2, so as to save time and increase throughput.

MC has also been performed on alignment mark $P_1$. To this end, spot 219a has been used to expose an area $B_1$ around the mark $P_1$.

While specific embodiments of the invention have been described above, it will be appreciated that the invention may be practiced otherwise than as described. The description is not intended to limit the invention.

What is claimed is:

1. An optical exposure method carried out on a substrate that is at least partially covered by a layer of radiation-sensitive material, the method comprising:
    providing a plurality of projection beams of radiation;
    irradiating a peripheral annulus of the layer of radiation-sensitive material with a first one of said projection beams; and
    irradiating at least one inner portion of the radiation-sensitive material situated nearer the center of the substrate than the inner periphery of the peripheral annulus with a second one of said projection beams;
    wherein said irradiating a peripheral annulus and said irradiating at least one inner portion are carried out with the substrate positioned at the same location.

2. An optical exposure method according to claim 1, wherein at least one of the at least one irradiated inner portion of the layer of radiation-sensitive material is adjacent to the irradiated peripheral annulus of the layer of radiation-sensitive material.

3. An optical exposure method according to claim 1, wherein at least one irradiated inner portion of the layer of radiation-sensitive material is a rectangular shape.

4. An optical exposure method according to claim 1, wherein at least one of the at least one irradiated inner portion of the layer of radiation-sensitive material contains an alignment mark on the substrate.

5. An optical exposure method according to claim 1, wherein at least one of the at least one irradiated inner portion of the layer of radiation-sensitive material contains a wafer identification mark.

6. A device manufacturing method comprising:
    providing a substrate that is at least partially covered by a layer of radiation-sensitive material;
    providing a plurality of projection beams of radiation;
    using patterning structure to endow at least one of the projection beams with a pattern in its cross-section;
    projecting the at least one patterned beam of radiation onto a target portion of the layer of radiation-sensitive material; and
    performing clearout of a portion of the layer of radiation-sensitive material not exposed in projecting the at least one patterned beam of radiation onto a target portion of the layer of radiation-sensitive material, said performing clearout including:
        irradiating a peripheral annulus of the layer of radiation-sensitive material with a first one of said projection beams; and
        irradiating at least one inner portion of the radiation-sensitive material situated nearer the center of the substrate than the inner periphery of the peripheral annulus with a second one of said projection beams;
        wherein said irradiating a peripheral annulus and said irradiating at least one inner portion are carried out with the substrate positioned at the same location.

7. A lithographic projection apparatus comprising:
    a main projection apparatus including,
    a first radiation system to provide a first projection beam of radiation,
    a support structure to support patterning structure, the patterning structure serves to pattern the first projection beam according to a desired pattern,
    a first substrate table to hold a substrate, and
    a first projection system to project the patterned first projection beam onto at least a target portion of the substrate; and
    an optical exposure apparatus including,
    a second radiation system to provide a second beam of radiation, the second radiation system embodied to provide a plurality of secondary component beams of radiation,
    a second substrate table to hold a substrate, the second substrate table can be rotated parallel to a plane of the substrate,
    a second projection system to project said second beam onto a portion of said substrate, the second projection system correspondingly comprises a plurality of secondary component projection systems, each of which serves to project one of said secondary component beams onto the substrate, and
    at least one of said secondary component projection systems is flexible in such a manner that an extremity thereof proximal the substrate can be displaced in a direction parallel to the plane of the substrate, while an extremity thereof distal the substrate remains fixed relative to said plane; and
        wherein the optical exposure apparatus and the main projection apparatus share metrology data.

8. A lithographic projection apparatus according to claim 7, wherein the said proximal extremity of said secondary component projection system is displaceable radially with respect to the plane of the substrate.

9. A lithographic projection apparatus according to claim 7, wherein each of the said secondary component projection systems is flexible in the said manner.

10. A lithographic projection apparatus according to claim 7, wherein at least one of the secondary component projection systems comprises a flexible light guide.

11. A lithographic projection apparatus according to claim 10, wherein the flexible light guide comprises a liquid-filled light guide.

12. A lithographic projection apparatus according to claim 7, wherein stencil holders are located between said second radiation system and said second substrate table, such that the radiation traversing each secondary component projection system can be provided with a stencil pattern.

13. A lithographic projection apparatus according to claim 12, wherein:
    said plurality of secondary component projection systems is two secondary component projection systems;
    each stencil pattern comprises an aperture in an opaque field;
    the aperture for one of the secondary component projection systems is larger than for the other secondary component projection system.

14. A lithographic projection apparatus according to claim 8, wherein said second radiation system comprises a cloverleaf lens.

15. A lithographic projection apparatus according to claim 8, wherein the optical exposure apparatus is provided with an alignment sensor to measure the position and orientation of the substrate with respect to the rotational axis of the second substrate table.

16. A lithographic projection apparatus according to claim 15, wherein the optical exposure apparatus further comprises a substrate moving device to adjust said position and/or orientation of the substrate on the second substrate table.

17. A lithographic projection apparatus according to claim 7, further comprising a substrate handling station wherein said optical exposure apparatus is adjacent to said substrate handling station.

18. A lithographic projection apparatus according to claim 7, further comprising a substrate handling station wherein said optical exposure apparatus is within said substrate handling station.

19. A lithographic projection apparatus comprising:
    a main projection apparatus, said main projection apparatus including
        a first radiation system to provide a first projection beam of radiation,
        a support structure to support patterning structure, the patterning structure serves to pattern the first projection beam according to a desired pattern,
        a first substrate table to hold a substrate, and
        a first projection system to project the patterned first projection beam onto at least a target portion of the substrate;
    an optical exposure apparatus, said optical exposure apparatus including
        a second radiation system to provide a second beam of radiation, the second radiation system embodied to provide a plurality of secondary component beams of radiation,
        a second substrate table to hold a substrate, the second substrate table can be rotated parallel to a plane of the substrate,
        a second projection system to project said second beam onto a portion of said substrate, the second projection system correspondingly comprises a plurality of secondary component projection systems, each of which serves to project one of said secondary component beams onto the substrate, and
        at least one of said secondary component projection systems is flexible in such a manner that an extremity thereof proximal the substrate can be displaced in a direction parallel to the plane of the substrate, while an extremity thereof distal the substrate remains fixed relative to said plane; and
    a beam splitting device configured to divert a portion of the first projection beam into the second radiation system of the optical exposure apparatus to create said second radiation beam.

20. A lithographic projection apparatus according to claim 7, further comprising a focusing system, the focusing system comprising;
    at least one lens; and
    at least one spacer; and
wherein the focusing system is self-aligning.

21. The optical exposure method according to claim 1, further comprising developing the irradiated at least one inner portion of the radiation-sensitive material.

22. The optical exposure method according to claim 1, wherein said irradiating at least one inner portion of the radiation-sensitive material terminates without removal of the irradiated at least one inner portion of the radiation-sensitive material from the substrate.

* * * * *